US008890290B2

(12) United States Patent
Vickers

(10) Patent No.: US 8,890,290 B2
(45) Date of Patent: Nov. 18, 2014

(54) DIFFUSING ACOUSTICAL CROSSTALK

(71) Applicant: STMicroelectronics, Inc., Coppell, TX (US)

(72) Inventor: Earl C. Vickers, Saratoga, CA (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

(21) Appl. No.: 13/962,516

(22) Filed: Aug. 8, 2013

(65) Prior Publication Data

US 2013/0322636 A1 Dec. 5, 2013

Related U.S. Application Data

(62) Division of application No. 13/401,736, filed on Feb. 21, 2012, now Pat. No. 8,532,305, which is a division of application No. 12/474,600, filed on May 29, 2009, now abandoned.

(51) Int. Cl.
*H01L 27/06* (2006.01)
*H04S 1/00* (2006.01)
*H04S 5/00* (2006.01)

(52) U.S. Cl.
CPC . *H04S 5/00* (2013.01); *H04S 1/005* (2013.01); *H04S 2420/07* (2013.01)
USPC ....... 257/533; 257/E32.121; 381/17; 381/309

(58) Field of Classification Search
CPC ............................. H04S 1/005; H04S 2420/07
USPC ..................... 381/17, 309; 257/533, E32.121
See application file for complete search history.

(56) References Cited

U.S. PATENT DOCUMENTS

| | | | | |
|---|---|---|---|---|
| 7,412,380 | B1 * | 8/2008 | Avendano et al. | 704/216 |
| 2002/0154783 | A1 * | 10/2002 | Fincham | 381/17 |
| 2006/0210087 | A1 * | 9/2006 | Davis et al. | 381/17 |

* cited by examiner

*Primary Examiner* — Elias M Ullah
(74) *Attorney, Agent, or Firm* — Seed IP Law Group PLLC

(57) ABSTRACT

When two loudspeakers play the same signal, a “phantom center” image is produced between the speakers. However, this image differs from one produced by a real center speaker. In particular, acoustical crosstalk produces a comb-filtering effect, with cancellations that may be in the frequency range needed for the intelligibility of speech. Methods for using phase decorrelation to fill in these gaps and produce a flatter magnitude response are described, reducing coloration and potentially enhancing dialogue clarity. These methods also improve headphone compatibility and reduce the tendency of the phantom image to move toward the nearest speaker.

20 Claims, 10 Drawing Sheets

DIFFUSING ACOUSTICAL CROSSTALK

CROSS-REFERENCE TO RELATED APPLICATION(S) AND CLAIM OF PRIORITY

The present application is a divisional of U.S. patent application Ser. No. 13/401,736, entitled "DIFFUSING ACOUSTICAL CROSSTALK," filed on Feb. 21, 2012, which claims priority to U.S. patent application Ser. No. 12/474,600, filed May 29, 2009, now abandoned. Application Ser. No. 13/401,736 is assigned to the assignee of the present application and is hereby incorporated by reference into the present application as if fully set forth herein. The present application hereby claims priority under 35 U.S.C. §120 to U.S. patent application Ser. No. 13/401,736.

TECHNICAL FIELD OF THE INVENTION

The invention relates to audio systems. More specifically, the invention describes a method and apparatus for using phase decorrelation to minimize the effects of acoustical crosstalk.

BACKGROUND OF THE INVENTION

There are a number of acoustical phenomena that are rarely noticed consciously by the average listener in a typical environment but nevertheless detract from optimal audio quality. One is acoustical crosstalk, which occurs when two loudspeakers play the same signal, creating a phantom center image. It is well known that acoustical crosstalk produces comb filtering with deep spectral notches, resulting in undesirable coloration and a loss of spectral information.

When two loudspeakers play the same signal, the resulting phantom center image differs from one produced by a real center speaker. In particular and as noted, acoustical crosstalk produces a comb-filtering effect, with cancellations that are typically in the frequency range needed for the intelligibility of speech. In addition, the phantom image is not as stable as that of a real center speaker, because it tends to follow the listener toward the nearest speaker due to the precedence effect. There are additional problems relating to mono-compatibility and speaker/headphone compatibility.

One solution to problems of phantom center images is simply to add a real center speaker. This approach had the advantage of providing a stable center image. However, for reasons of cost and space, many consumer audio and television systems do not include a center speaker. Therefore, an approach that works over two speakers is desired.

Another solution to the problem of acoustic crosstalk is to cancel it before it happens, using various crosstalk cancellation techniques. However, at mid and high frequencies, this is effective only within a relatively small "sweet spot," which limits the usefulness of this technique for typical television viewing and other situations involving multiple listeners in arbitrary positions.

Another way to address the non-flat magnitude response caused by acoustical crosstalk is to apply inverse filters to the left and right signals. However, the frequencies of the comb filter notches vary greatly depending on the relative positions of the speakers and listener. For example, the cancellation frequencies increase as the angle subtended by the speakers becomes narrower, such as when the listener moves further back. In addition, as the listener moves to the side and is no longer equidistant from the speakers, the notches move closer together and become different for each ear. Without a good estimate of the relative positions, it would be impossible to accurately equalize the effects of the crosstalk.

SUMMARY OF THE INVENTION

In one embodiment, a method of diffusing a signal using phase decorrelation at high frequencies for a mono input signal is described. A mono input signal is received and separated into a high-frequency signal and a low-frequency signal. The high-frequency signal is processed using a diffusion means, such as an allpass filter, creating a high-frequency left channel signal. A second diffusion means, such as a second non-identical allpass filter is used to process the high-frequency signal, creating a high-frequency right channel signal. As a result of these processes, a frequency-dependent delay is created between the high-frequency left channel signal and the right channel signal. The low-frequency signal is processed to create a delayed low-frequency signal. The delayed low-frequency signal is combined with the high-frequency left channel signal. The low-frequency signal is also combined with the high-frequency right channel signal. These combinations produce a stereo response with phase diffusion at high frequencies.

In another embodiment, a method of diffusing a signal using phase decorrelation at high frequencies for a stereo input signal is described. A left input signal is separated into a left high-frequency signal and a left low-frequency signal. Similarly, a right input signal is separated into a right high-frequency signal and a right low-frequency signal. An allpass filter, or other diffusion means, is applied to the left high-frequency signal, thereby creating an allpassed left high-frequency signal. Another diffusion means, such as a second non-identical allpass filter is applied to a right high-frequency signal, thereby creating an allpassed right high-frequency signal. A delayed left low-frequency signal and a delayed right low-frequency signal are created. The delayed left low-frequency signal is combined with the allpassed left high-frequency signal. The delayed right low-frequency signal is combined with the allpassed right high-frequency signal. These combinations produce a stereo response with phase diffusion at high frequencies.

Another embodiment is a system for diffusing a mono input signal using phase decorrelation at high frequencies. The system may consist of a high pass filter that accepts a mono input signal and outputs a high-frequency signal. Similarly, a low pass filter outputs a low-frequency signal from the mono input signal. Two allpass filters or other diffusion means create a high-frequency left channel signal and a high-frequency right channel signal. The allpass filters are not identical. Other types of diffusion means may be used, such as reverb. A delay component creates a delayed low-frequency signal that is input into two adders; one combines the low-frequency signal with the high-frequency left channel signal and another combines the low-frequency signal with the high-frequency right channel signal.

Another embodiment is a system for diffusing a stereo input signal having a left input and a right input using phase decorrelation at high frequencies. The system has a pair of filters consisting of a low pass filter and a high pass filter for processing the left input of the stereo signal. Another pair, also consisting of a low pass filter and a high pass filter, processes the right input of the stereo signal. The system also has two allpass filters, one for creating a high-frequency left channel signal and another for creating a high-frequency right channel signal. A delay component creates a delayed low-frequency left channel signal and another delay component creates a delayed low-frequency right channel signal. The high-frequency left channel signal and the delayed low-frequency left channel signal are combined using an adder. Another adder is used to combine the delayed low-frequency right channel signal and the high-frequency right channel signal.

BRIEF DESCRIPTION OF THE DRAWINGS

References are made to the accompanying drawings, which form a part of the description and in which are shown, by way of illustration, particular embodiments.

DETAILED DESCRIPTION OF THE INVENTION

Reference will now be made in detail to a particular embodiment of the invention, an example of which is illustrated in the accompanying drawings. While the invention is described in conjunction with the particular embodiment, it will be understood that it is not intended to limit the invention to the described embodiment. To the contrary, it is intended to cover alternatives, modifications, and equivalents as may be included within the spirit and scope of the invention as defined by the appended claims.

Methods and systems for creating a flatter magnitude response as an approach to alleviating phantom center image issued from acoustical crosstalk are described in the various figures. Acoustical crosstalk occurs when the same signal from a pair of speakers reaches the ear at slightly different times. While the resulting phase differences facilitate the stereo illusion at low frequencies, they also create a comb-filtering effect having a series of magnitude notches across the frequency spectrum. This coloration not only implies that the phantom center image will always sound somewhat different from a real center speaker, but it may also reduce the intelligibility of speech.

Figure 1:
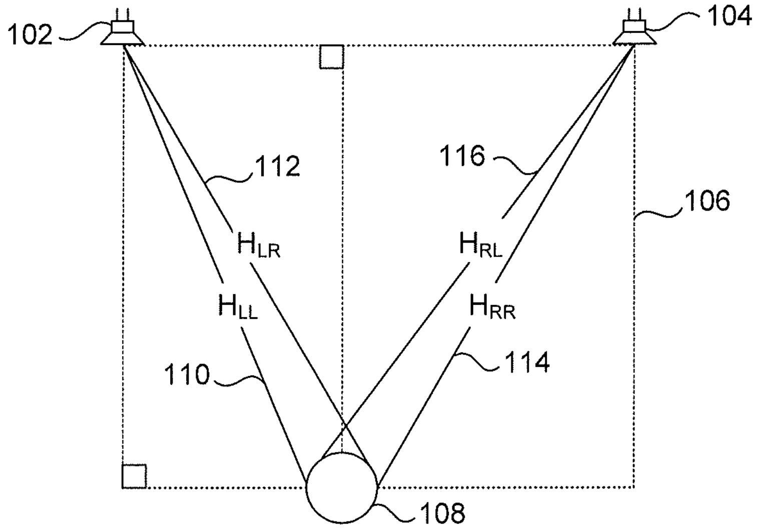
FIG. 1 is a simplified top-down view of an asymmetrical listening environment.

FIG. 1 is a simplified top-down view of an asymmetrical listening environment. Two loudspeakers 102 and 104 are shown at the upper left and right of a space 106. A listener's head is represented by circle 108, and speaker-to-ear paths are shown by diagonal lines 110, 112, 114 and 116, labeled as transfer functions $H_{LL}$, $H_{LR}$, $H_{RR}$ and $H_{RL}$, described below. As can be seen, $H_{LL}$ line 110 and $H_{LR}$ 112 are shorter than $H_{RR}$ line 114 and $H_{RL}$ line 116. Even in the unlikely case that the center of the listener's head (circle 108) is located exactly along the plane of symmetry between speakers 102 and 104, neither of the listener's ears will be located on the plane of symmetry, assuming the listener is facing forward. At each ear, the dual mono signal will be received from the two sources (speakers 102 and 104) with different time delays.

Figure 2A:
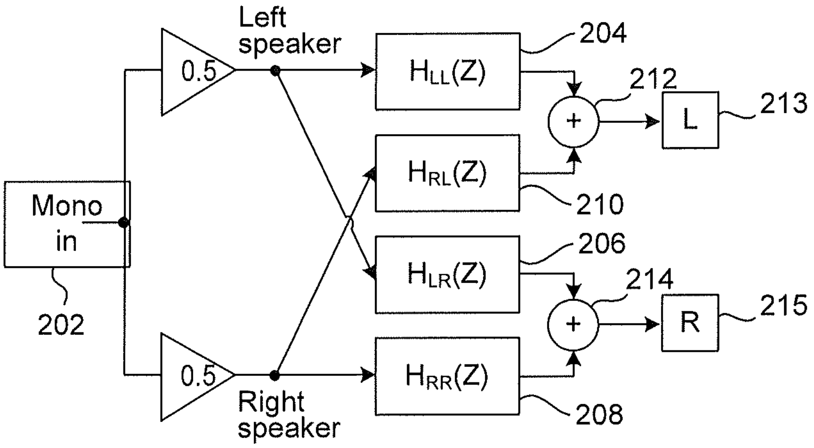
FIG. 2A is a block diagram of a system demonstrating acoustical crosstalk.

Acoustical crosstalk can be modeled or demonstrated by a system as shown in FIG. 2A which shows a simplified phantom mono acoustical crosstalk model. In this model, transfer functions $H_{LL}(z)$ 204 and $H_{RR}(z)$ 208 represent ipsilateral acoustical paths (or paths that are the same side of the listener) from left speaker to left ear $H_{LL}$ 110 and from right speaker to right ear $H_{RR}$ 114, respectively, and $H_{LR}(z)$ 206 and $H_{RL}(z)$ 210 represent contralateral acoustical paths (or paths that are on opposite sides of the listener) from left speaker to right ear $H_{LR}$ 112 and from right speaker to left ear $H_{RL}$ 116, respectively. A mono input signal 202 is transmitted to a right speaker and left speaker (not physically shown in FIG. 2A) with a gain of 0.5 in each channel. The left speaker signal is input to two acoustical transfer functions: $H_{LL}(z)$ shown as box 204 and $H_{LR}(z)$ shown as box 206. The right speaker signal is input to two acoustical transfer functions: $H_{RR}(z)$ shown as box 208 and $H_{RL}(z)$ shown as box 210. The outputs of acoustical transfer functions 204 and 210 are combined or added by adder 212 producing a left channel signal 213 and heard by the listener's left ear. The outputs of acoustical transfer functions 206 and 208 are combined by adder 214 producing a right channel signal 215 and heard by the listener's right ear. In this model, the transfer functions from a mono input to the two ears are given by:

$$H_L(z)=0.5[H_{LL}(z)+H_{RL}(z)], \text{ and}$$

$$H_R(z)=0.5[H_{LR}(z)+H_{RR}(z)].$$

Putting aside details such as head-shadowing, which creates a region of reduced amplitude of a sound due to obstructions from a listener's head, and focusing only on the phase cancellations, the functions can be modeled as:

$$H_L(z)=0.5[z^{-LL}+z^{-RL}] \text{ and}$$

$$H_R(z)=0.5[z^{-LR}+z^{-RR}]$$

where LL and RR are the ipsilateral delays and LR and RL are the contralateral delays, measured in samples.

Figure 2B:
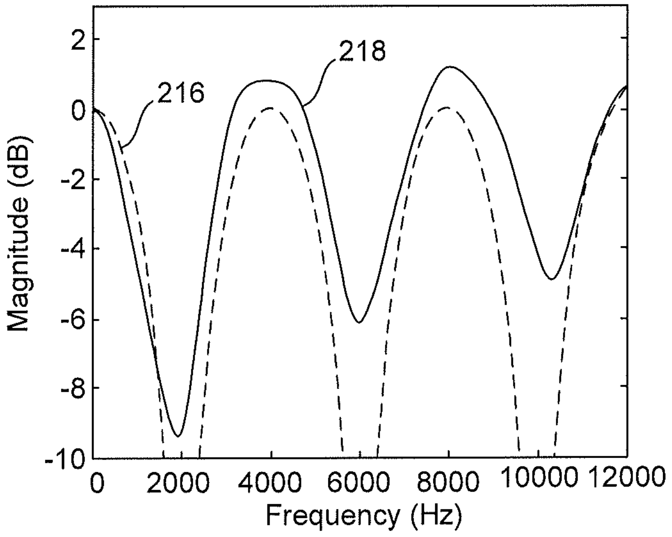
FIG. 2B is a graph showing a typical magnitude response resulting from the crosstalk depicted in FIG. 2A.

A typical magnitude response resulting from the crosstalk depicted in FIGS. 1 and 2A is shown by the dotted line 216 in FIG. 2B The solid line 218 in FIG. 2B represents simulated comb filtering response for a spherical head model.

Whenever acoustical delays from the left and right speakers to a single point (such as one ear) are unequal, there will be a series of frequencies at which the signals are 180° out of phase. Even if the right amount of electrical delay is added to equalize the acoustical delays from the left and right speakers to the left ear, the total delays will then be unequal at the right ear.

However, for intelligibility of speech consonants, it is not necessary to have a flat magnitude response at every frequency, due to the ear's "auditory filters." The ear assigns the same perceived loudness to narrow-band noise sources, regardless of the noise bandwidth, so long as that bandwidth is less than a critical bandwidth. Thus, even if there are cancellations within a given critical band, what is important is the total noise power within that band. This eliminates the need to have a flat magnitude response at all frequencies and, consequently, simplifies the problem considerably. In one embodiment, decorrelation of the phase differences between channels, within each critical band, as described below, effectively randomizes the cancellations and reduces their perceived effect. The term decorrelation may have different meanings in various contexts. Generally, it may refer to any process for reducing cross-correlation within a set of signals while preserving other aspects of the signals. In the current context, decorrelation transforms an audio signal, or a pair of related audio signals, into multiple output signals having waveforms that look different from each other but sound the same.

Figure 3:
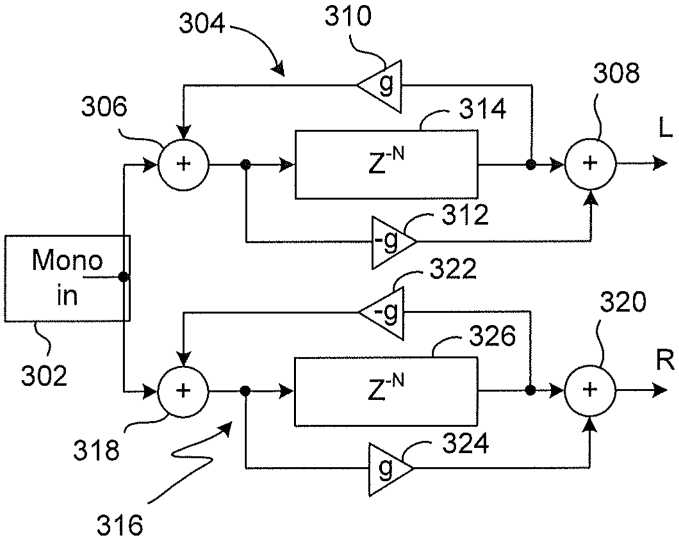
FIG. 3 shows a system for phase diffusion using a modified "Schroeder quasi-stereo" circuit with arbitrary gain, g.

There are a number of methods of generating diffused, decorrelated signals that are known in the field of acoustical engineering, including Feedback Delay Network (FDN) reverbs and convolution with time-limited white noise or "velvet noise." In one embodiment, phases between two speakers are decorrelated, while allowing the output of each speaker to be approximately allpass, that is, having unity gain at all frequencies. An allpass filter is one which generally allows all frequencies through. The amplitude response of an allpass filter is one at each frequency while the phase response can be arbitrary. This is beneficial in cases where a listener is seated closer to one speaker than to another. FIG. 3 shows a system for phase diffusion using a modified "Schroeder quasi-stereo" circuit with arbitrary gain, g. As is known in the art, a Schroeder quasi-stereo circuit was originally designed to produce a pseudo-stereo effect by creating phase differences using a pair of allpass filters. In Schroeder's original circuit, each output was allpass only if the feedback and feedforward gains equalled $\pm\sqrt{0.5}$; the current embodiment uses a different topology to allow more flexibility in the choice of gains. A mono signal 302 is input to two allpass filters. A left allpass filter 304 consists of adders 306 and 308, gains 310 and 312, and N-sample delay 314. A right allpass filter 316 consists of adders 318 and 320, gains 322 and 324, and N-sample delay 326.

Adder 306 adds mono input signal 302 to the output of feedback gain 310 and sends the result to feedforward gain 312 and N-sample delay 314. N-sample delay 314 delays its input by N samples and sends the delayed signal to feedback gain 310 and adder 308. Adder 308 adds the output of N-sample delay 314 to the output of feedforward gain 312 and sends the result to the left speaker.

Adder 318 adds mono input signal 302 to the output of feedback gain 322 and sends the result to feedforward gain 324 and N-sample delay 326. N-sample delay 326 delays its input by N samples and sends the delayed signal to feedback gain 322 and adder 320. Adder 320 adds the output of N-sample delay 326 to the output of feedforward gain 324 and sends the result to the right speaker.

Left and right allpass filters 304 and 316 are identical, except that in left allpass filter 304, the feedback gain 310 is positive (+g) and the feedforward gain 312 is negative, while in right allpass filter 316, the feedback gain 322 is negative and the feedforward gain 324 is positive. Therefore, while the impulse responses of the two filters are both allpass, the impulse responses are different due to the sign differences between the gains. Therefore the phase responses are different, producing envelope delay differences as a function of frequency, where an envelope delay generally is the propagation time delay undergone by an envelope of an amplitude modulated signal as it passes through a filter.

The system shown in FIG. 3 has allpass transfer functions $A_L(z)$ and $A_R(z)$, as follows:

$$A_L(z) = \frac{-g + z^{-N}}{1 - gz^{-N}}, \text{ and}$$

$$A_R(z) = \frac{g + z^{-N}}{1 + gz^{-N}}$$

Figure 4A:
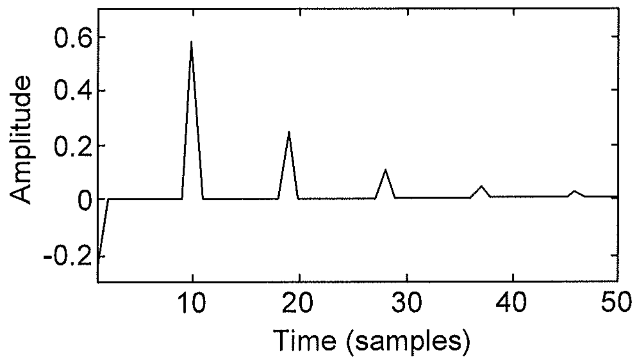
FIGS. 4A and 4B are graphs of left and right impulse responses from adders shown in FIG. 3.
Figure 4B:
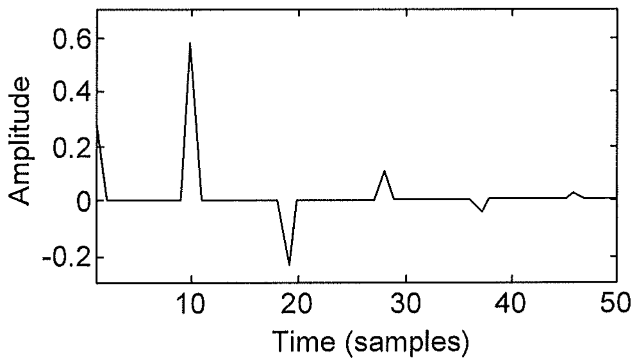

FIGS. 4A and 4B are graphs of the left and right impulse responses from adder 308 and adder 320, respectively, in FIG. 3. The y-axis measures amplitude and the x-axis measures time (in samples). The impulse responses shown in FIGS. 4A and 4B are for a gain of g=0.414. Note that the decays are exponential (with the exception of the first pulse), and alternate pulses are opposite in sign at the two outputs. The impulse responses are power-complementary (since both are allpass), that is, they are energy-preserving at all frequencies, but they are not in fact allpass-complementary, because the phasor sum of the two outputs does not have constant magnitude. Therefore, they are not exactly mono-compatible. However, the system shown in FIG. 3 would normally be used for playback, not for encoding or signal transmission, so there would be no need to mix the output back to mono.

The system of FIG. 3 results in the left and right phases being interleaved so that the left speaker leads at some frequencies and lags at others. The number of alternating "bands" corresponds to a delay length N. (If more than two speaker signals are needed, additional decorrelated outputs can be created by using different values of N.)

Figure 4C:
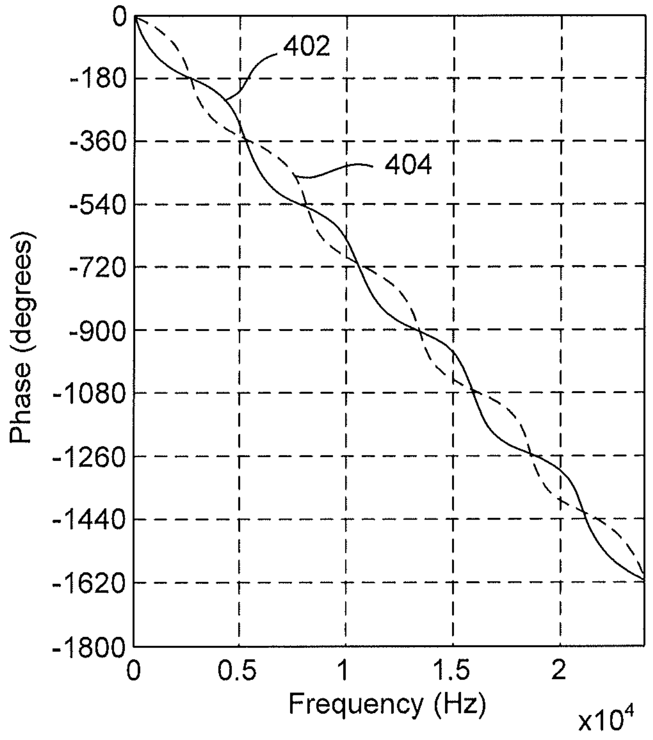
FIG. 4C is a graph showing left and right phase responses as a function of frequency.

The left and right phase responses, as a function of frequency, are shown in FIG. 4C in which the y-axis measures the phase response in degrees and the x-axis represents frequency in Hz. The solid line 402 represents the phase response of the left channel output from adder 308 in FIG. 3, while the dash-dot line 404 represents the phase response of the right channel output from adder 320.

It is preferable for delay N (measured in samples) to be long enough so that there are at least one or two alternating phase bands within each critical band of interest, in order to diffuse or perturb the cancellation patterns and smooth the perceived frequency response. The alternating phase bands are spaced linearly, with a spacing of $$b = \frac{f_s}{2N},$$

where $f_s$ is the sample rate in Hz. As is known in the art, the Equivalent Rectangular Bandwidth (ERB) provides an approximation of the bandwidth of filters used in human hearing, modeling the filters as rectangular allpass filters. The ERB of the human auditory filters is approximated by $$ERB = 24.7(0.00437F + 1),$$

where F is the center frequency in Hz. Assuming the lowest critical band of interest is centered near the lowest comb filter notch, which may be around 2 kHz, the smallest ERB of interest would be about 241 Hz. In order for the width b of our alternating phase bands to be less than the ERB, we have $$N > \frac{f_s}{2 \cdot 24.7(0.00437F + 1)}.$$

In this case, given a 48 kHz sampling rate, the delay N would be at least 100 samples, or about 2 ms.

While delay N needs to be sufficiently long, as described above, it is also preferable to avoid unnecessarily long values of N that might cause perceptible temporal smearing of impulsive sounds. Temporal smearing may be described generally as a spreading of transient or impulsive sounds over a longer period of time. If the impulse response is viewed as a type of reverberation, the reverberation time is given by:

$$T_r = \frac{-60N}{g_{dB} \cdot f_s},$$

where $T_r$ is the −60 dB reverberation time in seconds;

N is the length of the delay in samples;

$f_s$ is the sample rate in Hz; and $g_{dB}$ is allpass gain g expressed in dB.

Therefore, the reverberation time is proportional to the delay time and inversely proportional to the log of the gain.

With N=100, and g=0.414, for example, the −60 dB reverberation time $T_r$ is about 16 ms. This is a short decay time compared to that of most rooms, so the temporal smearing is unlikely to be perceptible over speakers with typical voice or music recordings. The values of allpass gains g and delays N can be tuned as desired to balance the various perceptual effects.

Figure 4D:
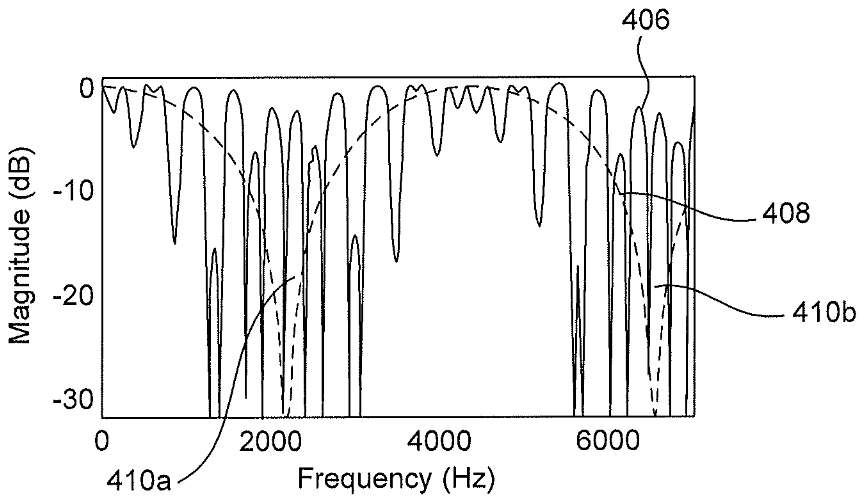
FIG. 4D is a graph showing the magnitude response of a simple delay model of acoustic crosstalk, at one ear, with speakers at ±30 degrees, with and without the crosstalk diffusion.

FIG. 4D is a graph showing the magnitude response of a simple delay model of the acoustic crosstalk, at one ear, with speakers at ±30 degrees. The dotted line 408 has deep cancellation notches, such as 410*a* and 410*b*, caused by acoustic crosstalk alone. One of the goals is to fill in these notches or gaps, which is accomplished to a large degree by the phase diffusion method described herein. In one embodiment, using the system of FIG. 3, the total magnitude response at one ear is shown by solid line 406. Note that the phase diffusion helps fill in cancellation notches 410*a* and 410*b* in dotted line 408, caused by acoustic crosstalk. While the diffusion introduces new notches as seen in solid line 406, these are smaller and closer together, and will be smoothed by the ear's auditory filters.

A drawback of the system depicted in FIG. 3 is that the phase diffusion is applied at all frequencies, including low frequencies where phase is an important localization cue. We would prefer to diffuse the left and right phases around 2 kHz (the approximate frequency of the lowest cancellation notch 410*a* in the example shown in FIG. 4D) and higher, without affecting the phase response at the lower frequencies.

Figure 5:
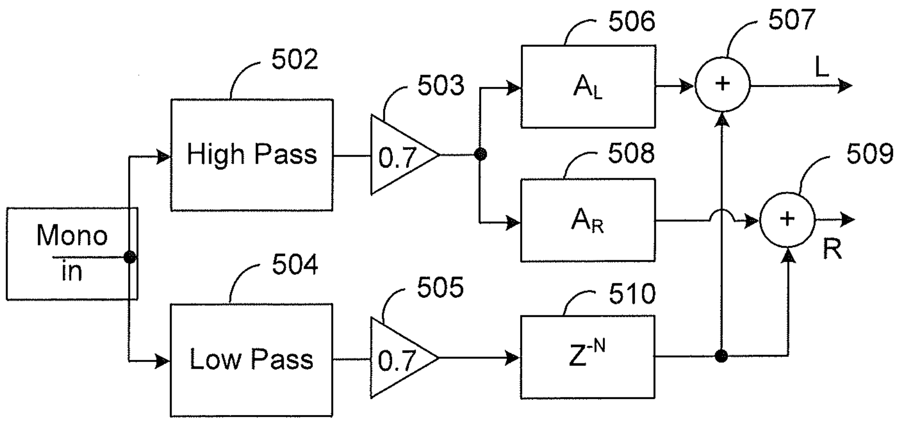
FIG. 5 is a block diagram of a system of complementary crossover filters and allpass filters capable of limiting phase diffusion to higher frequencies for a mono input signal in accordance with one embodiment.
Figure 8:
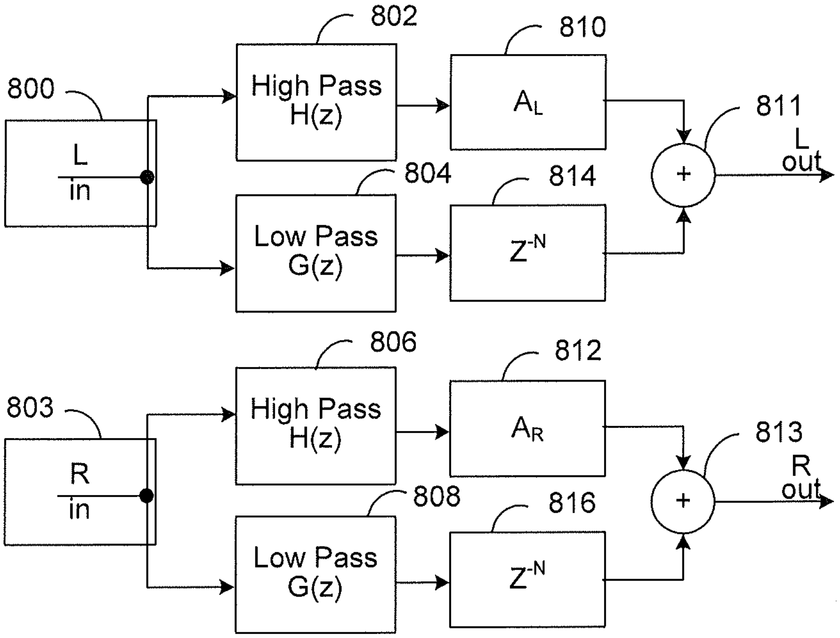
FIG. 8 is a diagram of a system for high-frequency phase diffusion for a stereo input signal using complementary crossover filters and allpass filters in accordance with one embodiment.

Since the ear's use of phase as a localization cue (that is, a cue to ascertain the direction of a sound source) is primarily limited to frequencies below about 1 kHz, and since one of the objectives of the various embodiments is to diffuse the left and right phases around 2 kHz and above, a pair of complementary crossover filters can be used (as shown in FIGS. 5 and 8 below) to limit phase diffusion to frequencies above a selected crossover frequency.

FIG. 5 is a block diagram of a system of complementary crossover filters capable of limiting phase diffusion to higher frequencies for a mono input signal in accordance with one embodiment. The mono input signal is applied to high pass filter 502 and low pass filter 504. The value of the low pass/high pass crossover cutoff frequency can be tuned as desired, but will typically be 1000 Hz or higher. The high frequencies output from high pass filter 502 are processed with a gain 503 of the square root of 0.5 (shown as 0.7) in order to normalize the reverberant sound pressure produced by the pair of allpass filters. The output of gain 503 is applied to allpass filter 506 and allpass filter 508. These allpass filters are used as a means for diffusion. In other embodiments, other diffusion means, such as reverb may be used. The low frequencies output from low pass filter 504 are processed with a gain 505 of the square root of 0.5 (shown as 0.7), again to normalize the reverberant sound pressure. The output of gain 505 is applied to delay 510, which delays the low-frequency path to match the average delay caused by allpass filters 506 and 508 in the high-frequency paths. The (low frequency) output of delay 510 is added to the (high frequency) output of allpass filter 506 using adder 507, and the result is sent to the left speaker. The (low frequency) output of delay 510 is also added to the (high frequency) output of allpass filter 508 using adder 509, and the result is sent to the right speaker. As a result, the left and right outputs have equal phase delays at low frequencies to preserve localization cues, and interleaved phase delays at high frequencies to diffuse the cancellation notches.

In one embodiment, the system shown in FIG. 5 may be implemented, for example, in a preprocessing chip or in firmware of an audio digital signal processor (DSP) of a television. In another example, the system may be implemented in a sound system amplifier.

Figure 6:
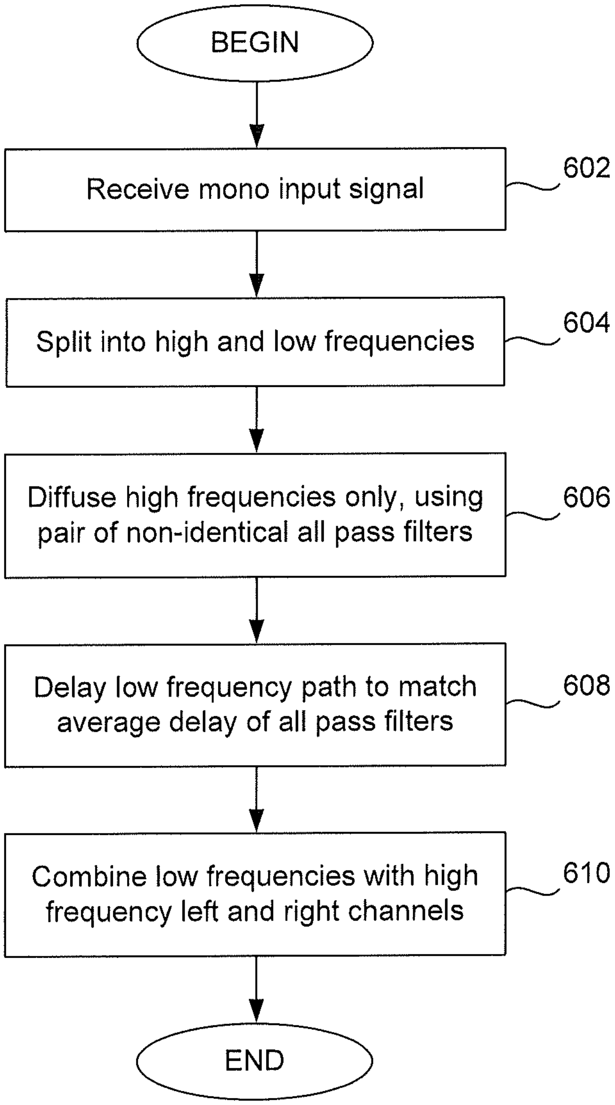
FIG. 6 is a flow diagram of a process of phase diffusion of high frequencies of a mono input signal in accordance with one embodiment.

FIG. 6 is a flow diagram of a process of phase diffusion of high frequencies of a mono input signal in accordance with one embodiment. At step 602 the system receives a mono input signal. At step 604 a mono input signal is processed by a high pass filter and a low pass filter, effectively splitting the signal into high and low frequencies. In one embodiment, a gain of the square root of 0.5 is applied to the outputs of the high pass and low pass filters. In other embodiments, other values for the gain may be applied. At step 606 the phase responses of the high frequencies of the input signal are diffused using two non-identical allpass filters or other diffusion means, such as reverb, one for the left channel and another for the right channel. The allpass filters apply phase diffusion only to the high frequencies. At step 608 the low frequencies are delayed so that the phase delay of the low-frequency path matches the average phase delay of the two allpass filters in the high-frequency paths, so the low-frequency and high-frequency paths are essentially synchronized. At step 610 the low frequencies are added with the left channel allpass filter output and with the right channel allpass filter output, as shown in FIG. 5. Finally, the left channel signal is outputted by a left speaker and the right channel signal is outputted by a right speaker.

Figure 7:
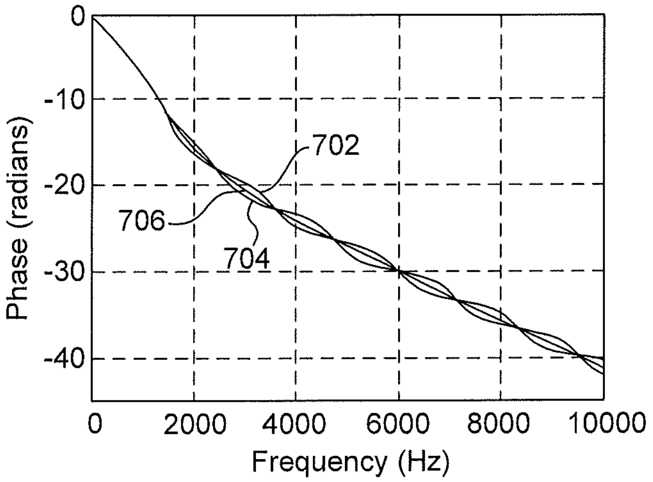
FIG. 7 is a graph showing phase responses of left and right outputs of adders shown in FIG. 5.

In FIG. 7, the two outside, interweaving curves 702 and 704 represent the phase responses of the left and right outputs of adders 507 and 509 in FIG. 5, while center curve 706 is the phase response of the output of the lowpass filter plus N-sample delay. This delay is included in order to compensate for the average phase response of the allpass filters and to prevent unnecessary cancellations. It is apparent from FIG. 7 that the phase diffusion is limited to the higher frequencies. This helps disrupt the phantom mono phase cancellations without adversely affecting low frequency phase-based spatial cues.

As noted, the system in FIG. 5 is designed to convert a mono input to left and right outputs in order to produce a flatter magnitude response, that is, a less problematic phantom center image. A system designed to work with stereo inputs is shown in FIG. 8. Here, the left and right inputs are processed separately, with allpass filters applied to the high pass filtered signals.

FIG. 8 shows a system for high-frequency phase diffusion for a stereo input signal using complementary allpass crossover filters in accordance with one embodiment. The system shown in FIG. 8 has components similar to those in FIG. 5. A stereo input signal consists of a left input signal 800 and a right input signal 803. Left input signal 800 is sent to high pass filter 802 and low pass filter 804. Left channel high frequencies passed by high pass filter 802 are sent to allpass filter $A_L$ 810, and the left channel low frequencies passed by low pass filter 804 are sent to delay 814. The outputs of allpass filter $A_L$ 810 and delay 814 are added together in adder 811 and sent to the left speaker. The right input signal is sent to high pass filter 806 and low pass filter 808. The right channel high frequencies passed by high pass filter 806 are sent to allpass filter $A_R$ 812, and the right channel low frequencies passed by low pass filter 808 are sent to delay 816. The outputs of allpass filter $A_R$ 812 and delay 816 are added together in adder 813 and sent to the right speaker. As described above, delays 814 and 816 are used to synchronize the low-frequency paths with the average delay of the high-frequency paths. Allpass filters $A_L$ and $A_R$ are similar but different from each other; for example, $$A_L(z) = \frac{-g + z^{-N}}{1 - gz^{-N}}, \text{ and}$$

$$A_R(z) = \frac{g + z^{-N}}{1 + gz^{-N}}.$$

As a result, any high-frequency phantom center content common to the left and right channels will be processed by $A_L$ for one output and by $A_R$ for the other, resulting in interweaving phase responses (phase diffusion) at high frequencies. At low frequencies, the left and right channels will be delayed by equal amounts, preserving low frequency phase-based spatial cues.

Figure 9:
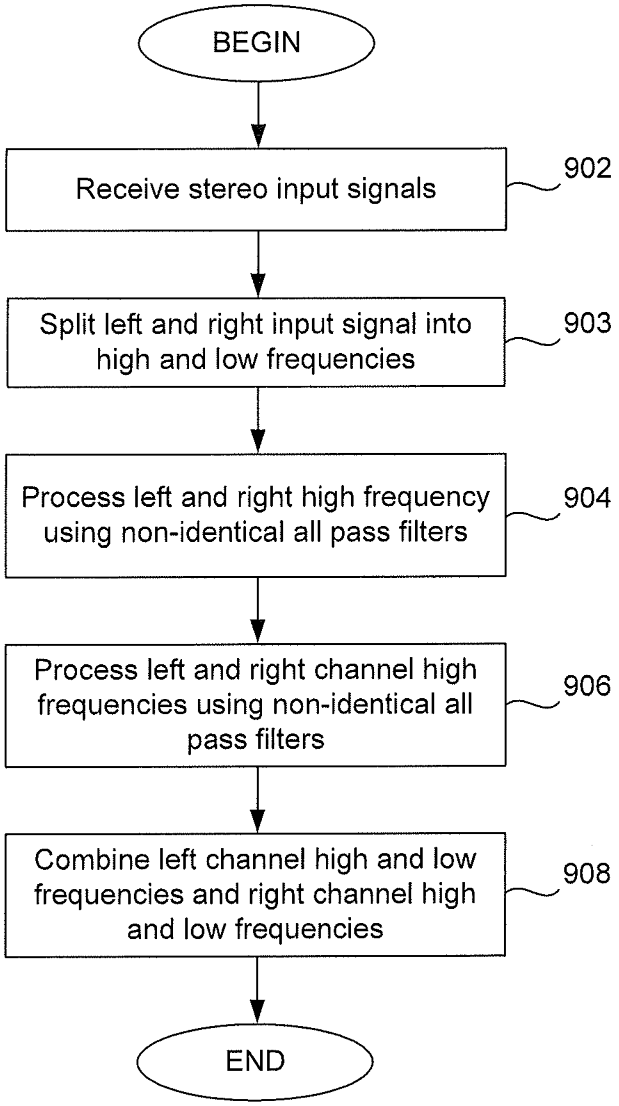
FIG. 9 is a flow diagram of a process of phase diffusion of high frequencies of a stereo input signal in accordance with one embodiment.

FIG. 9 is a flow diagram of a process of phase diffusion of high frequencies of a stereo input signal in accordance with one embodiment. At step 902 the system receives a left channel input signal and a right channel input signal. At step 903, each signal is split into high and low frequencies by a high pass and low pass filter. At step 904 the left and right channel high frequencies are processed separately using non-identical allpass filters. This creates interweaving phase delays between the left and right channels at high frequencies, diffusing the sound and breaking up the phase cancellations. At step 907 the left and right channel low-frequency paths are delayed to synchronize with the average delay of the high-frequency paths resulting from the allpass filters. At step 908 the high and low frequencies of each channel are added to form left and right output signals that are phase diffused only above the specified crossover frequency.

The crossover filters help minimize any increase in apparent image width, for example, the width of the phantom center image, because the phases in the low-frequency range, where phase is a primary localization cue, are not being diffused. In practice, a slight spreading or pseudo-stereo effect may still be apparent, especially when the speakers subtend an angle of greater than ±60°, however the widening is subtle, and not unpleasant for the smaller angles typically used for television viewing.

For listeners to the left or right of the line of symmetry between the speakers, the widening of the image causes the phantom center image's pull toward the nearest speaker to be somewhat less obvious. While the phantom image is still not centered exactly between the speakers, it is no longer so tightly focused toward one side.

When power-complementary crossover filters are used with the systems of FIGS. 5 and 8, undesired fluctuations of the power response can be noted in the vicinity of the crossover frequency, due to the interaction with the allpass filters. In a preferred embodiment, these can be minimized using magnitude-complementary filters, which have matching phase responses at all frequencies. A suitable lowpass response in one embodiment is $$G(z) = 0.5^2[A_1(z) + A_2(z)]^2 \text{ and the corresponding highpass response is } = 0.25\lfloor A_1^2(z) + 2A_1(z)A_2(z) + A_2^2(z)\rfloor,$$

$$H(z) = -0.5^2[A_1(z) - A_2(z)]^2 = -0.25\lfloor A_1^2(z) - 2A_1(z)A_2(z) + A_2^2(z)\rfloor,$$

where G(z) is the lowpass response, H(z) is the highpass response, and A1(z) and A2(z) are stable allpass transfer functions such that $$E(z)=0.5[A_1(z)+A_2(z)] \text{ and}$$

$$F(z)=0.5[A_1(z)-A_2(z)],$$

where E(z) is a lowpass prototype filter, and F(z) is a corresponding highpass filter, such that $$G(z)=E^2(z), \text{ and}$$

$$H(z)=-F^2(z).$$

Figure 10:
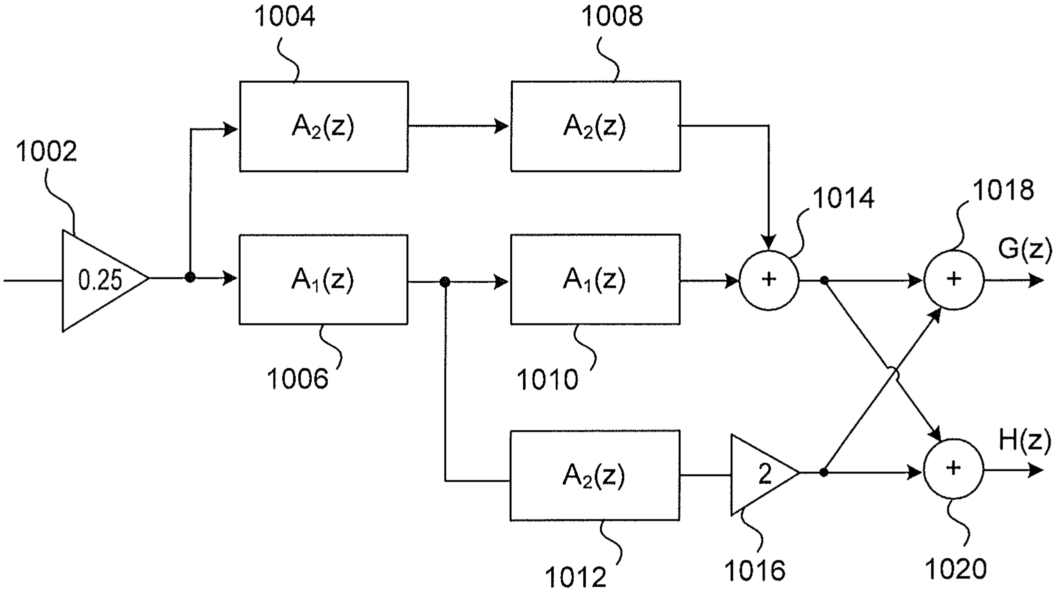
FIG. 10 is an efficient implementation of a magnitude-complementary filter pair.

A known efficient implementation of this magnitude-complementary filter pair is shown in FIG. 10. An input signal is scaled by 0.25 in gain 1002, the output of which is sent to allpass filter $A_2(z)$ 1004 and allpass filter $A_1(z)$ 1006. The output of allpass filter $A_2(z)$ 1004 is sent to another allpass filter with the same transfer function $A_2(z)$ 1008. The output of allpass filter $A_1(z)$ 1006 is sent to another allpass filter with the same transfer function $A_1(z)$ 1010, as well as to another allpass filter with transfer function $A_2(z)$ 1012. The output of allpass filters 1008 and 1010 are added in adder 1014. The output of allpass filter 1012 is scaled by 2.0 in gain 1016. The output of adder 1014 is added to the output of gain 1016 in adder 1018, yielding lowpass output signal G(z). The output of adder 1014 is subtracted from the output of gain 1016 in adder 1020, yielding highpass output signal H(z).

Decorrelating the left and right signals simply by adding early reflections or reverberation might unnecessarily color the frequency response or lengthen the impulse response. Furthermore, systems that decorrelate audio by creating magnitude differences in alternating frequency bands (for example, using pseudo-stereo comb filters) would create timbre problems for listeners located closer to one speaker than another. In addition, without the crossover filters shown in FIGS. 5 and 8, the resulting full-spectrum decorrelation would impose unwanted phase changes at low frequencies, where phase information is important for localization. Finally, without using in-phase magnitude-complementary crossover filters, there can be significant ripples in the power response near the crossover frequency.

The methods described facilitate filling in gaps or notches caused by phase cancellations, within the resolution of the ear's auditory filter, while minimizing any undesirable effects. These methods help reduce the perception of comb filter coloration changes that occur when moving the head. They may also enhance dialogue intelligibility, especially in acoustically dry environments. The mild spatial blurring helps make the collapse of the phantom image toward the nearest speaker somewhat less obvious, and it greatly improves the problem of headphone compatibility by spreading the center image so it does not seem to be located at a fixed point in the center of the head.

Although only a few embodiments of the present invention have been described, it should be understood that the present invention may be embodied in many other specific forms without departing from the spirit or the scope of the present invention. The present examples are to be considered as illustrative and not restrictive, and the invention is not to be limited to the details given herein, but may be modified within the scope of the appended claims along with their full scope of equivalents.

While this invention has been described in terms of a specific embodiment, there are alterations, permutations, and equivalents that fall within the scope of this invention. It should also be noted that there are many alternative ways of implementing both the process and apparatus of the present invention. It is therefore intended that the invention be interpreted as including all such alterations, permutations, and equivalents as fall within the true spirit and scope of the present invention.

What is claimed is:

1. A method of decorrelating a signal using phase diffusion at high frequencies, the method comprising:

separating a left input signal into a left high-frequency signal and a left low-frequency signal and separating a right input signal into a right high-frequency signal and a right low-frequency signal;

creating a diffused left high-frequency signal from the left high-frequency signal using a first diffuser;

creating a diffused right high-frequency signal from the right high-frequency signal using a second diffuser;

creating a delayed left low-frequency signal and a delayed right low-frequency signal wherein a delay of the delayed left low-frequency signal and a delay of the delayed right low-frequency signal are related to a delay of the first diffuser and a delay of the second diffuser; and combining the delayed left low-frequency signal with the diffused left high-frequency signal and combining the delayed right low-frequency signal with the diffused right high-frequency signal, thereby producing a stereo signal with phase diffusion at high frequencies.

2. The method of claim 1 further comprising accepting a left input signal and a right input signal.

3. The method of claim 1 wherein the first diffuser includes a first allpass filter and the second diffuser includes a second allpass filter.

4. The method of claim 3 further comprising:

applying in one of the first allpass filter or the second allpass filter, a positive feedback gain and a negative feedforward gain, concurrently applying in the other allpass filter a negative feedback gain and a positive feedforward gain, thereby creating a frequency-dependent delay between the diffused left high-frequency signal and the diffused right high-frequency signal.

5. The method of claim 1 wherein the delay of the delayed left low-frequency signal is substantially the same as an average of the delays of the first diffuser and the second diffuser.

6. The method of claim 1 wherein the delay of the delayed right low-frequency signal is substantially the same as an average of delays of the first diffuser and the second diffuser.

7. The method of claim 1 wherein combining the delayed left low-frequency signal with the diffused left high-frequency signal creates a left channel output signal and combining the delayed right low-frequency signal with the diffused right high-frequency signal creates a right channel output signal.

8. A system for decorrelating a signal using phase diffusion at high frequencies, the system comprising:

a left high pass filter and a left low pass filter adapted to output a left high-frequency signal and a left low-frequency signal, respectively;

a right high pass filter and a right low pass filter adapted to output a right high-frequency signal and a right low-frequency signal, respectively;

a first diffuser adapted to create a diffused left high-frequency signal from the left high-frequency signal;

a second diffuser adapted to create a diffused right high-frequency signal from the right high-frequency signal;

a first delay component adapted to output a delayed left low-frequency signal;

a second delay component adapted to output a delayed right low-frequency signal;

a left combiner adapted to combine the delayed left low-frequency signal with the diffused left high-frequency signal; and a right combiner adapted to combine the delayed right low-frequency signal with the diffused right high-frequency signal, wherein a delay of the delayed left low-frequency signal and a delay of the delayed right low-frequency signal are related to a delay of the first diffuser and a delay of the second diffuser.

9. The system of claim 8, wherein:

the left high pass filter and the left low pass filter are adapted to accept a left input signal; and the right high pass filter and the right low pass filter are adapted to accept a right input signal.

10. The system of claim 8, wherein the first diffuser includes a first allpass filter and the second diffuser includes a second allpass filter.

11. The system of claim 10, wherein:

one of the first allpass filter and the second allpass filter applies a positive feedback gain and a negative feedforward gain; and the other of the first allpass filter and the second allpass filter applies a negative feedback gain and a positive feedforward gain, whereby a frequency-dependent delay is created between the diffused left high-frequency signal and the diffused right high-frequency signal.

12. The system of claim 8, wherein the delay of the delayed left low-frequency signal is substantially the same as an average of the delays of the first diffuser and the second diffuser.

13. The system of claim 8, wherein the delay of the delayed right low-frequency signal is substantially the same as an average of the delays of the first diffuser and the second diffuser.

14. The system of claim 8, wherein:

the left combiner outputs a left channel output signal; and the right combiner outputs a right channel output signal.

15. A processing chip for decorrelating a signal using phase diffusion at high frequencies, the system comprising:

a left high pass filter and a left low pass filter adapted to output a left high-frequency signal and a left low-frequency signal, respectively;

a right high pass filter and a right low pass filter adapted to output a right high-frequency signal and a right low-frequency signal, respectively;

a first diffuser adapted to create a diffused left high-frequency signal from the left high-frequency signal;

a second diffuser adapted to create a diffused right high-frequency signal from the right high-frequency signal;

a first delay component adapted to output a delayed left low-frequency signal;

a second delay component adapted to output a delayed right low-frequency signal;

a left combiner adapted to combine the delayed left low-frequency signal with the diffused left high-frequency signal; and a right combiner adapted to combine the delayed right low-frequency signal with the diffused right high-frequency signal, wherein a delay of the delayed left low-frequency signal and a delay of the delayed right low-frequency signal are related to a delay of the first diffuser and a delay of the second diffuser.

16. The processing chip of claim 15, wherein:

the left high pass filter and the left low pass filter are adapted to accept a left input signal; and the right high pass filter and the right low pass filter are adapted to accept a right input signal.

17. The processing chip of claim 15, wherein the first diffuser includes a first allpass filter and the second diffuser includes a second allpass filter.

18. The processing chip of claim 17, wherein:

one of the first allpass filter and the second allpass filter applies a positive feedback gain and a negative feedforward gain; and the other of the first allpass filter and the second allpass filter applies a negative feedback gain and a positive feedforward gain, whereby a frequency-dependent delay is created between the diffused left high-frequency signal and the diffused right high-frequency signal.

19. The processing chip of claim 15, wherein:

the delay of the delayed left low-frequency signal is substantially the same as an average of the delays of the first diffuser and the second diffuser; and the delay of the delayed right low-frequency signal is substantially the same as an average of the delays of the first diffuser and the second diffuser.

20. The processing chip of claim 15, wherein:

the left combiner outputs a left channel output signal; and the right combiner outputs a right channel output signal.

* * * * *